(12) United States Patent
Long et al.

(10) Patent No.: US 10,510,780 B2
(45) Date of Patent: Dec. 17, 2019

(54) ARRAY SUBSTRATE AND DISPLAY DEVICE

(71) Applicant: BOE Technology Group Co., Ltd., Beijing (CN)

(72) Inventors: Chunping Long, Beijing (CN); Pan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/746,687

(22) PCT Filed: Jul. 7, 2017

(86) PCT No.: PCT/CN2017/092174
§ 371 (c)(1),
(2) Date: Jan. 22, 2018

(87) PCT Pub. No.: WO2018/103330
PCT Pub. Date: Jun. 14, 2018

(65) Prior Publication Data
US 2019/0027497 A1    Jan. 24, 2019

(30) Foreign Application Priority Data

Dec. 5, 2016   (CN) .................... 2016 2 1322702 U (51) Int. Cl.
*H01L 27/12* (2006.01)
*G02F 1/1362* (2006.01)
(Continued)

(52) U.S. Cl.
CPC .......... *H01L 27/124* (2013.01); *G02F 1/1368* (2013.01); *G02F 1/134363* (2013.01);
(Continued)

(58) Field of Classification Search
CPC ............. H01L 27/124; G02F 1/134363; G02F 1/1368; G02F 1/136286; G02F 1/1343; G02F 1/1362
See application file for complete search history.

(56) References Cited

U.S. PATENT DOCUMENTS 5,977,562 A  * 11/1999  Hirakata ........... G02F 1/134363
                                            257/59
7,663,583 B2 *  2/2010  Lee .................. G02F 1/134363
                                            257/72
(Continued)

FOREIGN PATENT DOCUMENTS

CN  102436106 A  5/2012
CN  103311253 A  9/2013
(Continued)

OTHER PUBLICATIONS

Sep. 27, 2017—(WO) International Search Report and Written Appn PCT/CN2017/092174 with English Tran.

*Primary Examiner* — Bilkis Jahan
*Assistant Examiner* — Victor V Barzykin
(74) *Attorney, Agent, or Firm* — Banner & Witcoff, Ltd.

(57) ABSTRACT

An array substrate and a display are provided. The array substrate includes a plurality of sub-pixel regions arranged in rows and columns. The sub-pixel region includes a pixel aperture region. A conductive pattern is provided between two adjacent sub-pixel regions in a row direction, at least part of the conductive pattern being located between pixel aperture regions of the two adjacent sub-pixel regions in the row direction, and the conductive pattern being connected to a common voltage.

19 Claims, 6 Drawing Sheets

(51) Int. Cl.
*G02F 1/1368* (2006.01)
*G02F 1/1343* (2006.01)

(52) U.S. Cl.
CPC .. *G02F 1/136286* (2013.01); *G02F 2201/121* (2013.01); *G02F 2201/123* (2013.01)

(56) References Cited

U.S. PATENT DOCUMENTS

| | | |
|---|---|---|
| 2004/0041970 A1 | 3/2004 | Lee et al. |
| 2006/0279668 A1 | 12/2006 | Paik et al. |
| 2007/0002244 A1* | 1/2007 | Park .................. G02F 1/134363 349/141 |
| 2009/0207365 A1* | 8/2009 | Lee .................. G02F 1/134363 349/141 |
| 2014/0176843 A1 | 6/2014 | Cao et al. |

FOREIGN PATENT DOCUMENTS

| | | |
|---|---|---|
| CN | 103676373 A | 3/2014 |
| CN | 206248976 U | 6/2017 |

* cited by examiner

ARRAY SUBSTRATE AND DISPLAY DEVICE

The application is a U.S. National Phase Entry of International Application No. PCT/CN2017/092174 filed on Jul. 7, 2017, designating the United States of America and claiming priority to Chinese Patent Application No. 201621322702.2 filed on Dec 5, 2016. The present application claims priority to and the benefit of the above-identified applications and the above-identified applications are incorporated by reference herein in their entirety.

TECHNICAL FIELD

The present disclosure relates to the field of liquid crystal display (LCD), and particularly to an array substrate and a display device.

BACKGROUND

In existing LCD devices, an In-Plane Switching (IPS) mode mainly utilizes a pixel electrode and a common electrode disposed at a same side of a liquid crystal layer to deflect liquid crystal (LC) molecules within a plane parallel to a display plane by an in-plane electrical field generated between the pixel electrode and the common electrode, and is capable of achieving a higher contrast and a wider viewing angle compared to conventional Twisted Nematic (TN) mode. In the IPS mode, however, a mutual interference is easily generated between electrical fields of adjacent pixel regions, leading to a disorder of electrical field at edges of adjacent pixel regions, which creates phenomena, such as light leakage and color mixture, and reduces the aperture ratio and impact the display performance of the display devices.

SUMMARY

The embodiment of the present disclosure provides an array substrate and a display device thereof, which can mitigate a degradation of display performance in existing display devices of IPS mode due to disordering of electrical field at edges of pixels.

According to a first aspect of the present disclosure, an array substrate is provided, comprising a plurality of sub-pixel regions arranged in rows and columns, the sub-pixel region comprising a pixel aperture region. A conductive pattern is provided between two adjacent sub-pixel regions in a row direction, at least part of the conductive pattern being located between pixel aperture region of the two adjacent sub-pixel regions in the row direction; and the conductive pattern being connected to a common voltage.

In an example, each of the sub-pixel regions is provided with a common electrode, the common electrode being connected to the common voltage by connecting to a common voltage line, and the common voltage line being provided between two adjacent rows of pixel aperture regions.

In an example, the array substrate comprises a first conductive layer in which both of the conductive pattern and the common electrode are provided.

In an example, the common electrode is connected to at least one adjacent conductive pattern, the at least one adjacent conductive pattern being a conductive pattern located between a sub-pixel region where the common electrode is located and an adjacent sub-pixel region.

In an example, two conductive patterns that are provided at two sides of a same sub-pixel region in the row direction are connected to each other.

In an example, two conductive patterns that are provided at a same side of two adjacent sub-pixel regions in a column direction are connected to each other.

In an example, in the first conductive layer, a first connecting pattern is provided between the two conductive patterns provided at a same side of two adjacent sub-pixel regions in the column direction; a data line is provided between two adjacent columns of pixel aperture regions; and at least part of the first connecting pattern is separated from the data line.

In an example, in the first conductive layer, a second connecting pattern is provided between the two conductive patterns provided at two sides of a same sub-pixel region in the row direction; a data line is provided between two adjacent columns of pixel aperture regions; and at least part of a region where the second connecting pattern is provided is separated from a region where the data line is provided.

In an example, the conductive pattern is located between two adjacent common voltage lines; the first connecting pattern is connected to the common voltage line at a portion overlapped with the common voltage line; and the conductive pattern is connected to the common voltage line by the first connecting pattern.

In an example, a length of a projection of the first connecting pattern in the row direction is smaller than a length of a projection of the conductive pattern in the row direction.

In an example, a material of the first conductive layer is metallic material.

In an example, the sub-pixel region is provided with a pixel electrode, the pixel electrode including an extension portion extending along the row direction, the extension portion and the common voltage line being overlapped with each other.

In an example, a gate line is provided between two adjacent rows of pixel aperture regions, and a data line is provided between two adjacent columns of pixel aperture regions, a line width of the gate line at an intersection with the data line being smaller than a line width of the gate line between two adjacent data lines, and/or, a line width of the common voltage line at an intersection with the data line being smaller than a line width of the common voltage line between two adjacent data lines.

In an example, a gate line is provided between two adjacent rows of pixel aperture regions; and the conductive pattern is located between two adjacent gate lines.

In an example, the sub-pixel region is provided with a pixel electrode; a gate line is provided between two adjacent rows of pixel aperture regions; a data line is provided between two adjacent columns of pixel aperture regions; and the sub-pixel region is further provided with a switching transistor, a gate of the switching transistor being connected to the gate line, a first pole other than the gate being connected to the data line, and a second pole being connected to the pixel electrode. The data line and the first pole of the switching transistor are connected by an extension pattern of the data line, the extension pattern being provided with an opening at a portion overlapped with the gate line.

In an example, a gate line is provided between two adjacent rows of pixel aperture regions; a data line is provided between two adjacent columns of pixel aperture regions; and the sub-pixel region is further provided with a switching transistor, a gate of the switching transistor being connected to the gate line, a first pole other than the gate being connected to the data line, and a second pole being connected to the pixel electrode. The data line and the first pole of the switching transistor are connected by an extension pattern of the data line, the extension pattern including more than one line-shaped portion extending along the row direction.

According to a second aspect of the present disclosure, a display device is provided, comprising the array substrate.

BRIEF DESCRIPTION OF THE DRAWINGS

In order to demonstrate clearly technical solutions of the embodiments of the present invention, the accompanying drawings in relevant embodiments of the present invention will be introduced briefly. It is apparent that the drawings may only relate to some embodiments of the disclosure, from the figures those skilled in the art may obtain other figures without any creative labors.

DETAILED DESCRIPTION

Technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any creative efforts, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection, or mechanical connection, it may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
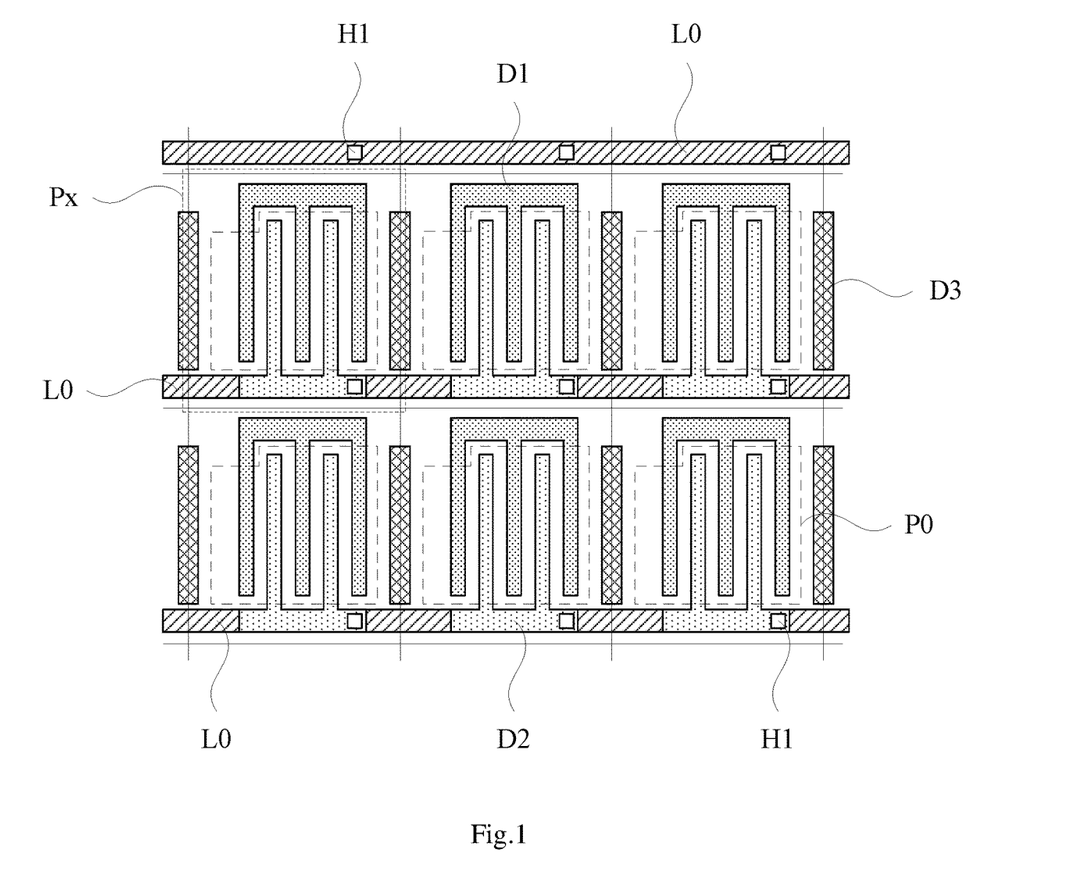
FIG. 1 is a structural schematic view illustrating an array substrate provided by an embodiment of the present disclosure.

FIG. 1 is a structural schematic view illustrating an array substrate provided by an embodiment of the present disclosure. Referring to FIG. 1, the array substrate of the present embodiment includes a plurality of sub-pixel regions Px (FIG. 1 illustrates boundary lines between different sub-pixel regions Px by mesh lines) which are arranged in rows and columns (in the drawings, a horizontal direction indicates the row direction, and a vertical direction indicates the column direction); and the sub-pixel region Px includes a pixel aperture region P0. The pixel aperture region refers to a region of the array substrate which is used to allow display light to be transmitted there-through. The sub-pixel region Px is provided with a single pixel electrode D1 and a single common electrode D2 which may generate an in-plane electrical field there-between so as to achieve liquid crystal display of IPS mode. For example, each of the electrodes D1 and D2 has an insertable finger-like shape. The common electrode D2 is connected to a common voltage line L0 (for clarity of illustration, the common electrode D2 that is connected to the uppermost common voltage line L0 is not drawn in FIG. 1), the common voltage line L0 is disposed between two adjacent rows of pixel aperture regions P0 (i.e., an extending direction of the common voltage line L0 is identical with the row direction). As a result, the common voltage line L0 may serve to provide a common voltage for the common electrode D2 in each of the sub-pixel regions Px. In addition, a conductive pattern D3 is disposed between two adjacent sub-pixel regions Px in the row direction; at least part of the conductive pattern D3 is located between pixel aperture regions P0 of two adjacent sub-pixel regions Px in the row direction; and the conductive pattern is connected to the common voltage. The conductive pattern D3 may be connected to the common voltage by being connected to the common electrode D2 and/or the common voltage line L0 (either directly, or indirectly, not illustrated in FIG. 1).

Referring to FIG. 1, when a data voltage is applied between the pixel electrode D1 and the common electrode D2 in each of the sub-pixel regions Px, an in-plane electrical field with an intensity corresponding to a magnitude of the data voltage is generated between the pixel electrode D1 and the common electrode D2 in a same sub-pixel region Px so that the LC display under IPS mode is achieved by deflecting LC molecules. In a case without the conductive pattern D3, an electrical field line (also referred to as electric fluxline) with a starting point on the pixel electrode D1 will be terminated on the common electrode D2 in a same sub-pixel region Px, and will also be terminated on the common electrodes D2 in a sub-pixel region Px adjacent thereto in the row direction (i.e., the electrical field line spans across a boundary line between two adjacent sub-pixel regions in the row direction), leading to a mutual interference between electrical fields of the two adjacent sub-pixel regions in the row direction. When a distortion of electrical field in the pixel aperture region P0 caused by the mutual interference reaches a certain degree, LC molecules at edges of the pixel aperture region P0 may be deflected abnormally, which may lead to problems, such as light leakage, and color mixture. However, in the present embodiment, with the arrangement of the conductive pattern D3 which is at least partly disposed between two adjacent pixel aperture regions P0 in the row direction, the above-mentioned electrical field line spanning across sub-pixel regions Px will be more likely to be terminated on the conductive pattern D3 which is closer and also applied with the common voltage, so as to mitigate the degree of mutual interference between the two adjacent sub-pixel regions in the row direction.

Based on the design in which a conductive pattern is disposed between two adjacent pixel aperture regions in the row direction, at least part of the conductive pattern is located between adjacent pixel aperture regions in the row direction, and the conductive pattern is connected to the common voltage, the conductive pattern provided by the present embodiment can change an electrical field distribution in surrounding space; in this way, the electrical field line that has a starting point on the pixel electrode and is pointed to an adjacent sub-pixel region can be at least partly terminated on the conductive pattern, so as to mitigate the mutual interference between the electrical fields of adjacent sub-pixel regions, and correct the disorder of electrical field at edges of pixels in display devices of IPS mode. Compared to the existing technology, the embodiment of the present disclosure can mitigate problems caused by the disorder of electrical field at edges of pixels, such as light leakage, and color mixture, and facilitate improving the pixel aperture ratio and achieving high resolution, thereby optimizing the display performance.

It should be noted that, the dimension, shape and arrangement manner of the sub-pixel regions; the dimension, shape, and relative positional relationship of the pixel electrode and the common electrode; the dimension, shape, and position of the pixel aperture region; the specification, and shape of the common voltage line; as well as the dimension; and shape of the conductive pattern, etc. are merely illustrative and can be changed according to actual demands in a practical implementations, which are not particularly defined in the present disclosure. For example, the conductive pattern D3 may have a straight line shape extending longitudinally as illustrated in FIG. 1, and may also have a broken line shape or a curved shape. For example, a projection of at least part of the conductive pattern D3 in the row direction is located between two adjacent common electrodes D2. Furthermore, the common electrode D2 connected to the common voltage line L0 through a first via hole H1, as illustrated in FIG. 1, is merely illustrative, and when it is implemented, the connection between the common electrode and the common voltage may be established by other ways according to actual demands (e.g., the connection between the common electrode and the common voltage can be established by a conductive black matrix pattern); in addition, the common voltage line may also be disposed between two adjacent columns of pixel aperture regions, which is not particularly defined in the present disclosure. It should be noted that, the small white squares in the drawings indicate locations to be formed with via holes and locations in layer structures to be connected through via holes, instead of indicating that these locations should be hollowed or blanked.

Figure 2:
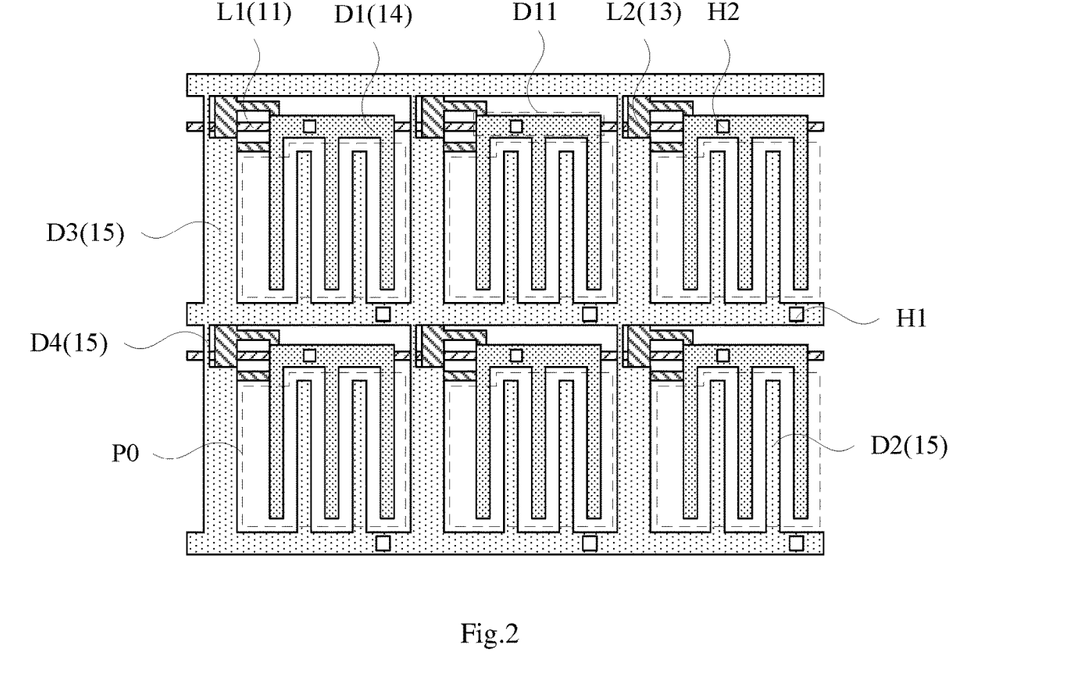
FIG. 2 is a structural schematic view illustrating an array substrate provided by another embodiment of the present disclosure.

As one of possible implementations, FIG. 2 is a schematic diagram illustrating an array substrate provided by another embodiment of the present disclosure. Referring to FIG. 2, the array substrate in the present embodiment includes a base substrate, a gate conductive layer 11, a first insulating layer, an active layer 12, a second insulating layer, a source/drain conductive layer 13, a third insulating layer, a second conductive layer 14, a first conductive layer 15, and a fourth insulating layer, which are stacked in sequence; the base substrate, the first insulating layer, the second insulating layer, the third insulating layer, and the fourth insulating layer are not illustrated in the drawings.

Figure 3:
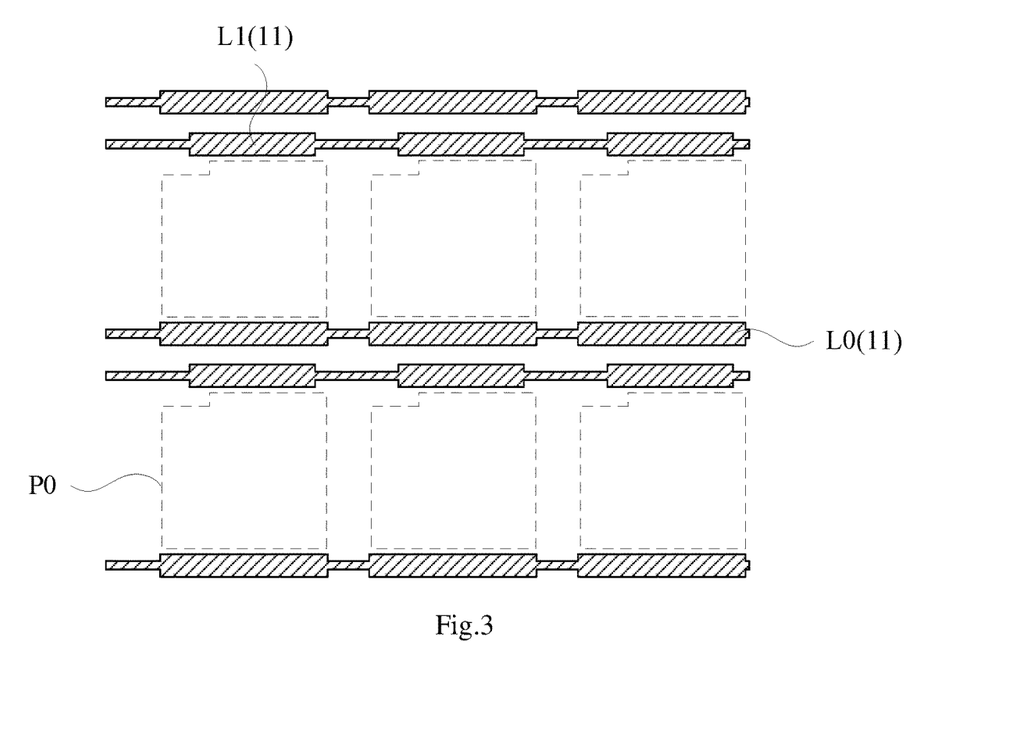
FIG. 3 is a schematic diagram illustrating an arrangement manner of a gate conductive layer in the array substrate of FIG. 2.

FIG. 3 is a schematic diagram illustrating an arrangement manner of the gate conductive layer in the array substrate of FIG. 2. Referring to FIG. 2 and FIG. 3, the gate conductive layer 11 includes a common voltage line L0 and a gate line L1 both located between two adjacent rows of pixel aperture regions P0. In the present disclosure, the gate conductive layer 11 is formed on a surface of the base substrate by patterning a conductive material. The conductive material used may be, for example, Cu, Al, Mo, Ni, and the like. The gate conductive layer is disposed outside the pixel aperture region P0, so it may be formed of opaque, conductive materials.

Figure 4:
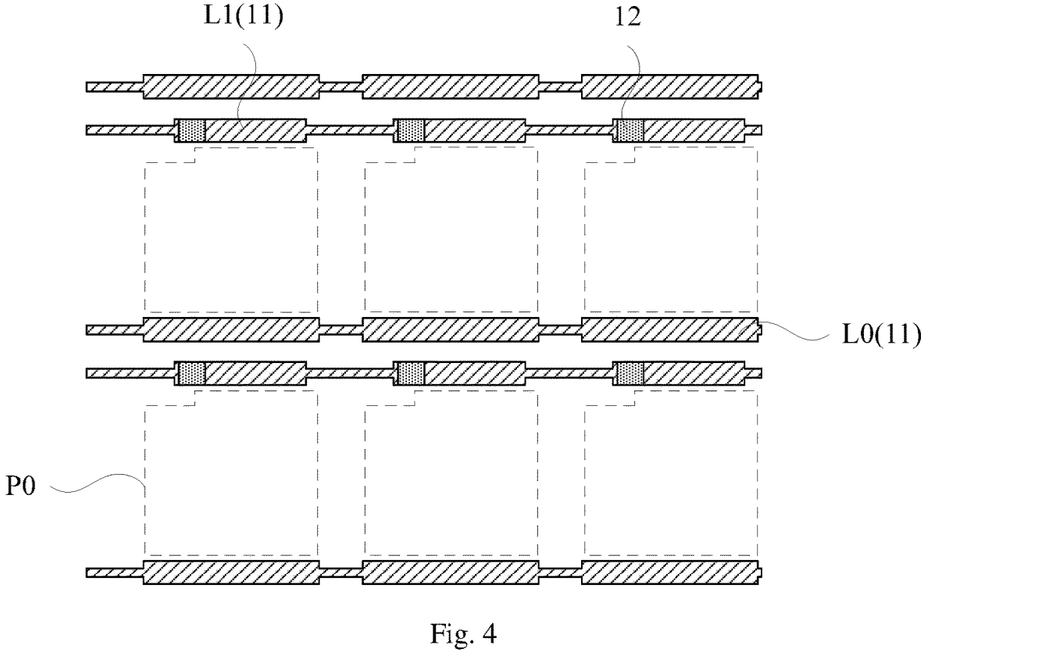
FIG. 4 is a schematic diagram illustrating an arrangement manner of the gate conductive layer and an active layer in the array substrate of FIG. 2.

FIG. 4 is a schematic diagram illustrating an arrangement manner of the gate conductive layer and an active layer in the array substrate of FIG. 2. Referring to FIG. 2 and FIG. 4, the active layer 12 is disposed in a region formed with a switching transistor (e.g., a thin film transistor, TFT), and is overlapped with the gate line L1. A material of forming the active layer may be selected from semi-conductor materials according to the switching transistor to be formed, which is not particularly defined in the present disclosure. The gate conductive layer 11 and the active layer 12 are disposed one on top of another and spaced from each other. The first insulating layer may be formed on the base substrate and the gate conductive layer 11 by a preparing process, such as chemical vapor deposition (CVD), from transparent insulating materials, such as Silicon Oxide, Silicon Nitride, and transparent resin, so as to be used as a gate insulator (GI) of the switching transistor to be formed.

Figure 5:
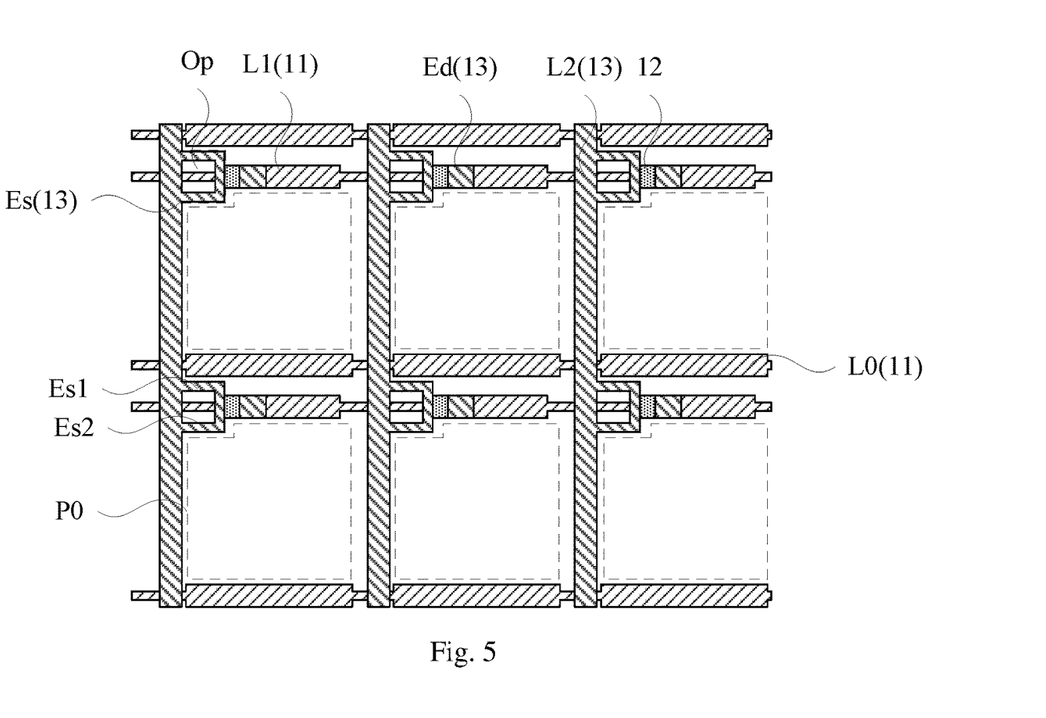
FIG. 5 is a schematic diagram illustrating an arrangement manner of the gate conductive layer, the active layer and a source/drain conductive layer in the array substrate of FIG. 2.

FIG. 5 is a schematic diagram illustrating an arrangement manner of the gate conductive layer, the active layer, and a source/drain conductive layer in the array substrate of FIG. 2. Referring to FIG. 2 through FIG. 5, the source/drain metallic layer 13 includes a data line L2, an extension pattern Es of the data line and a drain pattern Ed of the switching transistor. The data line L2 is located between two adjacent columns of pixel aperture regions P0, for example, the data line and the conductive pattern D3 are overlapped with each other. The extension pattern Es is provided with an opening Op at a portion overlapped with the gate line L1, and is connected to a left end of the active layer 12 through a via hole in the second insulating layer; the drain pattern Ed is connected to a right end of the active layer 12 through a via hole in the second insulating layer. In this way, each of the sub-pixel regions is formed with a switching transistor, a gate of the switching transistor is formed by a gate line L1 overlapped with the active layer 12 (i.e., the gate is connected to a gate line corresponding to a sub-pixel region where the gate is located), a source of the switching transistor is formed by an extension pattern Es connected to the active layer 12 (i.e., the source is connected to a data line corresponding to a sub-pixel region where the source is located by the extension pattern), and a drain of the switching transistor is connected to the pixel electrode D1 in the second conductive layer 14 through a second via hole H2 in the third insulating layer (i.e., the drain is connected to a pixel electrode corresponding to a sub-pixel region where the drain is located). In addition, it can be seen from FIG. 4 and FIG. 5 that, a line width of the gate line L1 at an intersection with the data line L2 is smaller than a line width of the gate line L1 between two adjacent data lines L2; and a line width of a portion of the common voltage line L0 at an intersection with the data line L2 is smaller than a line width of a portion of the common voltage line L0 between two adjacent data lines L2.

In the preparing ways, the above-mentioned second insulating layer may be formed on the first insulating layer and the active layer 12 by a preparing process, such as chemical vapor deposition (CVD), from transparent insulating materials, such as Silicon Oxide, Silicon Nitride, and transparent resin; connecting holes for source and drain may be formed in the second insulating layer by a patterning process; and the above-mentioned source/drain metallic layer 13 may be formed on the second insulating layer by patterning a conductive material (the conductive material used may be, for example, Cu, Al, Mo, Ni, or the like; the source/drain metallic layer is disposed outside the pixel aperture region P0, so it may be formed of opaque conductive materials). Subsequently, the third insulating layer may be formed on the second insulating layer and the source/drain metallic layer 13 by a patterning process, such as chemical vapor deposition (CVD), from transparent insulating materials, such as Silicon Oxide, Silicon Nitride, and transparent resin; the second via hole H2 may be formed in the third insulating layer by a patterning process; and the above-mentioned second conductive layer 14 may be formed on the third insulating layer from a transparent conductive material by a patterning process. The third insulating layer can keep the pixel electrode D1 being insulated from structures under the pixel electrode, in some possible implementations, the third insulating layer may also be formed as a planarization layer, to provide a planar surface for forming the pixel electrode D1.

Figure 6:
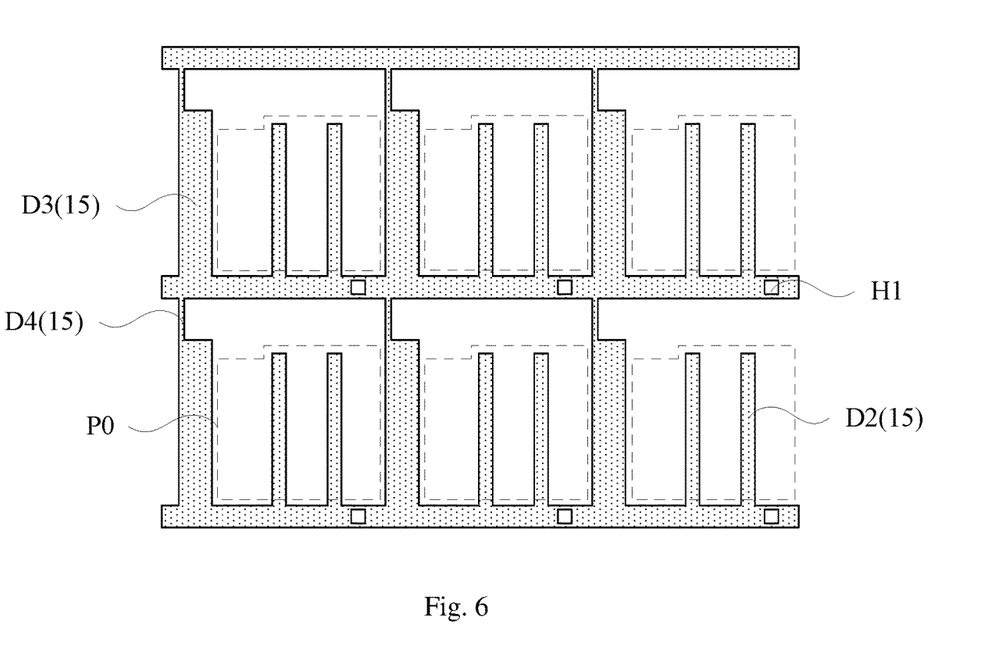
FIG. 6 is a schematic diagram illustrating an arrangement manner of a first conductive layer in the array substrate of FIG. 2.

FIG. 6 is a schematic diagram illustrating an arrangement manner of a first conductive layer in the array substrate of FIG. 2. Referring to FIG. 2 and FIG. 6, the first conductive layer 15 includes a common electrode D2, a conductive pattern D3, and a first connecting pattern D4. The conductive pattern D3 is located between two adjacent gate lines L1; the common electrode D2 is connected to two conductive patterns adjacent thereto, in which the term "conductive pattern adjacent thereto" refers to a conductive pattern 3 located between a sub-pixel region where the common electrode D2 is located and an adjacent sub-pixel region. In this way, two conductive patterns D3 that are disposed at two sides of a same sub-pixel region in the row direction are connected by the common electrode D2. Furthermore, the common electrode D2 in each of the sub-pixel regions is connected to a corresponding common voltage line L0 through a first via hole H1 disposed in the third insulating layer, the second insulating layer, and the first insulating layer; and a mesh-like pattern formed by the first conductive layer 15, as illustrated in FIG. 6, delivers the common voltage on the common voltage line L0 to every location on the mesh-like pattern. Referring to FIG. 2 and FIG. 6, two conductive patterns disposed at a same side of two adjacent sub-pixel regions in the column direction are connected by the first connecting pattern D4, a region where the first connecting pattern D4 is disposed is separated from a region where the data line L2 is disposed; that is, the first connecting pattern D4 and the data line L2 do not overlap in a direction perpendicular to the substrate. In the manufacturing process, the above-mentioned first via hole H1 may be formed in the third insulating layer, the second insulating layer, and the first insulating layer by a patterning process; the above-mentioned first conductive layer 15 may be formed on the third insulating layer from transparent conductive materials by a patterning process; and the above-mentioned fourth insulating layer may be formed on the third insulating layer, the first conductive layer 15 and the second conductive layer 14 from transparent insulating materials, such as Silicon Oxide, Silicon Nitride, and transparent resin, by a preparing process, such as chemical vapor deposition (CVD), so as to form a protection layer and a planarization layer of the pixel electrode D1 and the common electrode D2.

In other possible implementations, layer structures in the array substrate may be added, omitted, or exchanged in positions according to actual demands; for example, an insulating material layer may be added between the first conductive layer 15 and the second conductive layer 14; or, the first conductive layer 15 and the second conductive layer 14 may be combined as a single layer; or the second insulating layer may be omitted so that the source/drain conductive layer 13 is directly connected to the active layer 12; or, instead, the switching transistor in the sub-pixel region may be formed as a top-gate structure, which are not limited in the present disclosure.

It can be seen that, the array substrate illustrated in FIG. 2 through FIG. 6 is provided with a conductive pattern which is at least partly located between adjacent pixel aperture regions in the row direction and is connected to the common voltage; in this way, the electrical field distribution in the surrounding space can be changed so that the electrical field line, with a staring point on the pixel electrode and pointing to an adjacent sub-pixel region, can be at least partly terminated on the conductive pattern so as to mitigate the mutual interference between the electrical fields of adjacent sub-pixel regions and correct the disorder of electrical field at edges of pixels in display devices of IPS mode. Compared to the existing technology, the embodiment of the present disclosure can mitigate the problems caused by the disorder of electrical field at edges of pixels in display devices, such as light leakage, and color mixture, and facilitate improving the pixel aperture ratio and achieving high resolution, thereby optimizing the display performance.

It should be noted that, the first conductive layer and the second conductive layer in the present embodiment are formed of transparent conductive materials (e.g., silver nanowire material, or indium tin oxide ITO), but in other embodiments of the present disclosure, the first conductive layer and/or the second conductive layer may be formed of metallic materials (e.g., Al, Cu, Al alloy, Cu alloy, or the like); the common electrode and/or the pixel electrode within the pixel aperture region may be formed from a pattern of thin metallic wire; a uniformity of the common voltage may be improved by a relatively low resistivity of metallic materials; and a thickness that the conductive pattern has to be reached for satisfying conductive requirements is decreased.

Figure 7:
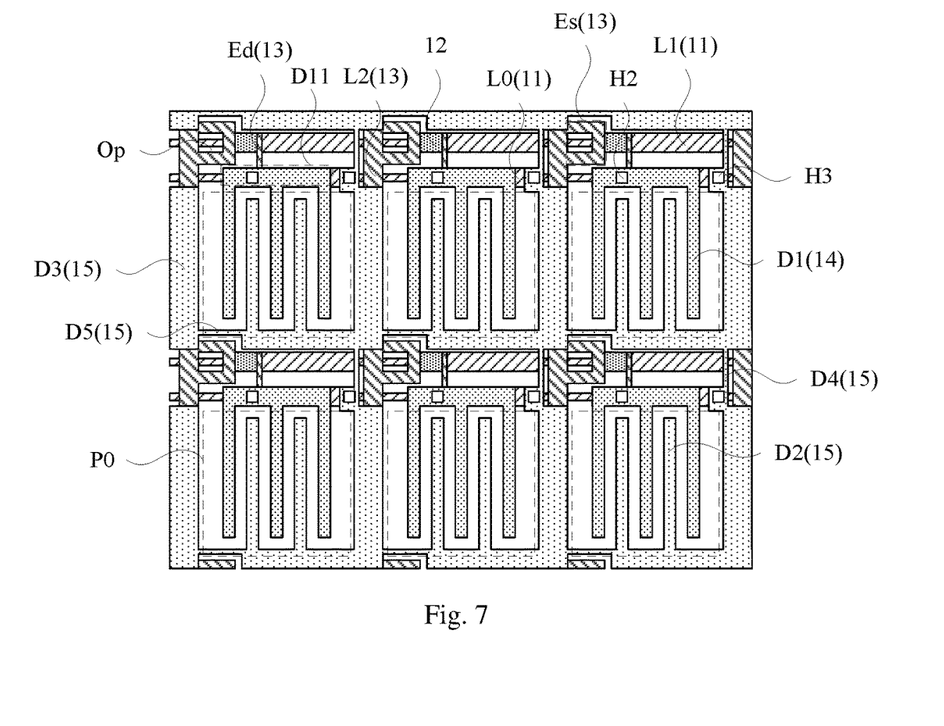
FIG. 7 is a structural schematic view illustrating an array substrate provided by yet another embodiment of the present disclosure.
Figure 8:
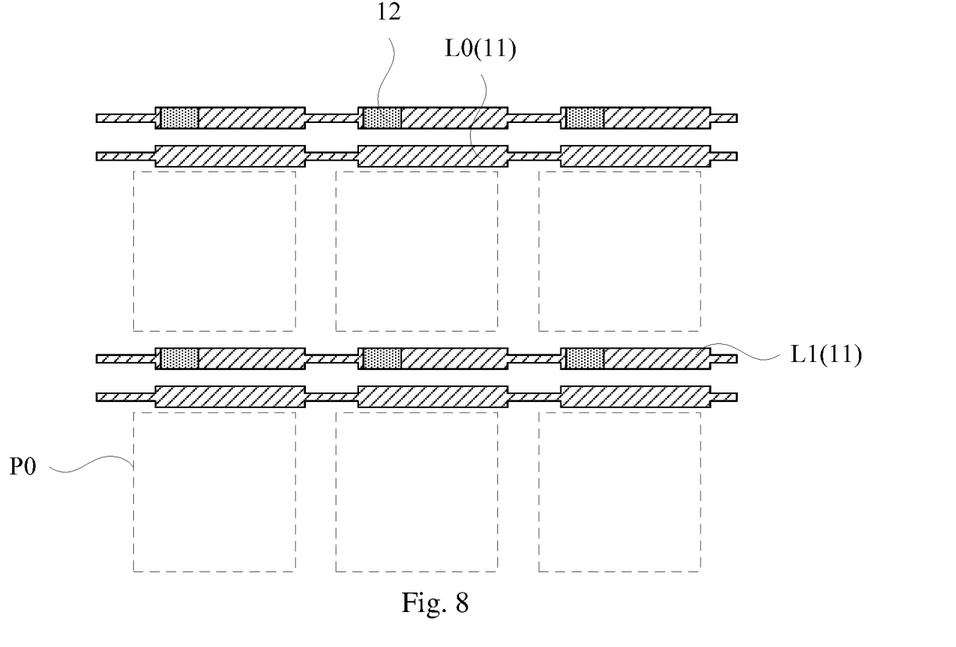
FIG. 8 is a schematic diagram illustrating an arrangement manner of the gate conductive layer and an active layer in the array substrate of FIG. 7.
Figure 9:
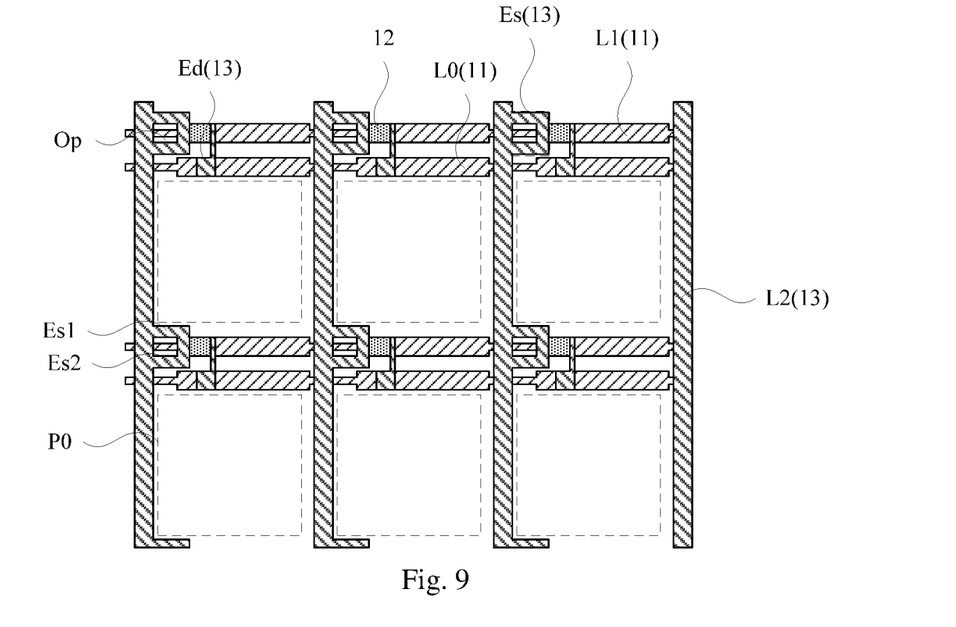
FIG. 9 is a schematic diagram illustrating an arrangement manner of the gate conductive layer, the active layer and a source/drain conductive layer in the array substrate of FIG. 7.
Figure 10:
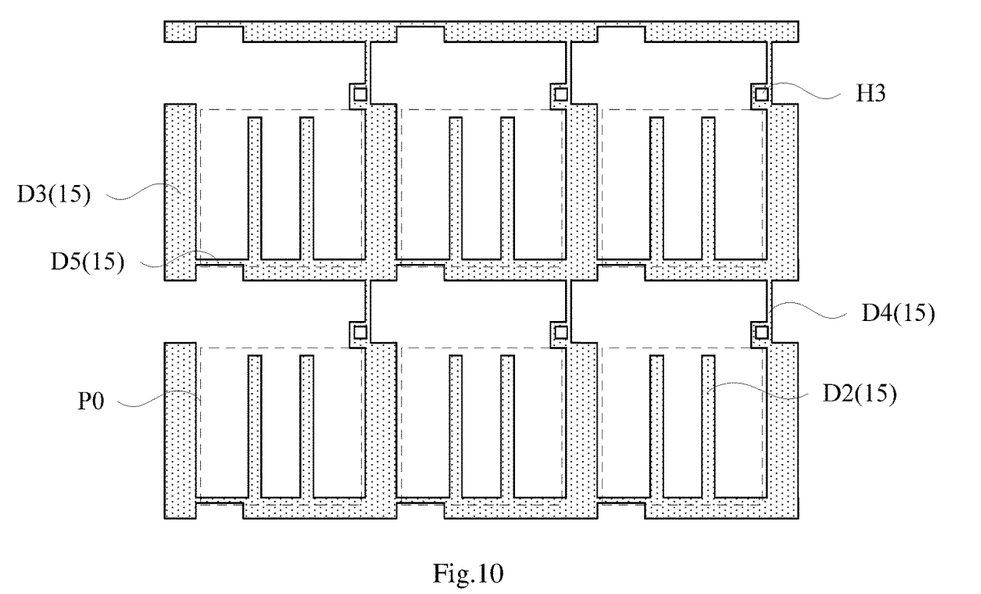
FIG. 10 is a schematic diagram illustrating an arrangement manner of a first conductive layer in the array substrate of FIG. 7.

As yet another possible implementation, FIG. 7 is a structural schematic view illustrating an array substrate provided by yet another embodiment of the present disclosure; FIG. 8 is a schematic diagram illustrating an arrangement manner of the gate conductive layer and an active layer in the array substrate of FIG. 7; FIG. 9 is a schematic diagram illustrating an arrangement manner of the gate conductive layer, the active layer and a source/drain conductive layer in the array substrate of FIG. 7; and FIG. 10 is a schematic diagram illustrating an arrangement manner of a first conductive layer in the array substrate of FIG. 7.

The array substrate in the present embodiment includes a base substrate, a gate conductive layer 11, a first insulating layer, an active layer 12, a second insulating layer, a source/drain conductive layer 13, a third insulating layer, a second conductive layer 14, a first conductive layer 15, and a fourth insulating layer, which are stacked in sequence. The base substrate, the first insulating layer, the second insulating layer, the third insulating layer, and the fourth insulating layer are not shown in the drawings. The array substrate (a first substrate for short) illustrated in FIG. 7 through FIG. 10 is different from the array substrate (a second substrate for short) illustrated in FIG. 2 through FIG. 6 in points described below.

In the array substrate illustrated in FIG. 2, the gate line L1 and the common voltage line L0 that are corresponding to each of the sub-pixel regions are located above and below the pixel aperture region P0, respectively; the extension portion D11 extending in the row direction included in the pixel electrode D1 is overlapped with the gate line L1; the common voltage line L0 is overlapped with the common electrode D2. As a comparison, in the array substrate illustrated in FIG. 7, the gate line L1 and the common voltage line L0 that are corresponding to each of the sub-pixel regions both are located above the pixel aperture region P0; the extension portion D11 extending in the row direction included in the pixel electrode D1 is overlapped with the common voltage line L0.

Due to the above difference, the pixel electrode D1 and the common voltage line L0 in FIG. 7 are overlapped with each other, which can increase a storage capacitance of the sub-pixel region and facilitate improving the LC display performance. As a comparison, the implementation illustrated in FIG. 2 can simplify the connection between the pixel electrode D1, and the drain pattern Es of the switching transistor, and the connection between the common electrode D2 and the common voltage line L0. It can reduce the area of the drain pattern Es, omit part of arrangement of the first connecting pattern D4, improve a reliability of the electrical connection between layer structures, and facilitate reducing the area of a single sub-pixel region. It should be appreciated that, relative positional relationships among the gate line L1, the common voltage line L0, and the pixel aperture region P0 may be arbitrarily designed according to actual demands, which are limited in the present disclosure.

The above-mentioned first array substrate and second substrate share the following common characteristics in terms of various aspects.

From a first aspect, the array substrates of the two structures both include a first conductive layer, in which both the conductive pattern and the common electrode are disposed. In this way, the conductive pattern is formed along with the common electrode, which facilitates simplifying the preparing process of the array substrate.

From a second aspect, the common electrode is connected to two conductive patterns adjacent thereto (a "conductive pattern adjacent thereto" refers to a conductive pattern located between a sub-pixel region where the common electrode is located and an adjacent sub-pixel region). In this way, when the conductive pattern is not connected to the common electrode, a corresponding connecting structure may be omitted; when the conductive pattern is connected to the common electrode, the uniformity and the stability of the common voltage on the common electrode and the conductive pattern may be improved by constituting a parallel connection. It should be appreciated that, when the common electrode is only connected to a single conductive pattern adjacent thereto, at least part of the technical effects mentioned above may also be achieved.

From a third aspect, the two conductive patterns disposed at two sides of a same sub-pixel region in the row direction are always connected to each other, and the two conductive patterns disposed at a same side of two adjacent sub-pixel regions in the column direction are connected to each other. In this way, a mesh-like arrangement of the conductive patterns may be achieved, which facilitates improving the uniformity and the stability of the common voltage on the conductive pattern.

From a fourth aspect, the first conductive layer includes a first connecting pattern which is disposed between the two conductive patterns located at a same side of two adjacent sub-pixel regions in the column direction, and the first connecting pattern is separated from the data line. In this way, it can reduce a parasitic capacitance between the first connecting pattern and the data line, and facilitate mitigating a signal delay in the data line and crosstalk. The first array substrate differs from the second array substrate in that: the former illustrates a first conductive layer 15 which includes a first connecting pattern D4 disposed between two conductive patterns D3 located at two sides of a same sub-pixel region, and it also includes a second connecting pattern D5 which is disposed between two conductive patterns D3 located at a same side of two adjacent sub-pixel regions in the column direction, and the second connecting pattern D5 is also separated from the data line L2 so as to reduce the parasitic capacitance there-between. Moreover, the first array substrate also differs from the second array substrate in that: the conductive pattern D3 is located between two adjacent common voltage lines L0; the first connecting pattern D4 also achieves a connection between the conductive pattern D3 and the common voltage (i.e., the conductive pattern D3 achieves the connection to the common voltage line L0 by the first connecting pattern D4), and a connection between the common electrode D1 and the common voltage line L0, at a portion of the first connecting pattern D4 overlapped with the common voltage line L0, by utilizing a third via hole replacing the first via hole H1 in FIG. 2 through FIG. 6. However, in other implementations of the present disclosure, the common electrode and the conductive pattern may, respectively, be connected to the common electrode line at a plurality of locations, so as to further improve the uniformity and the stability of the common voltage on the first conductive layer.

From a fifth aspect, in the first conductive layer, the first connecting pattern is disposed between two adjacent conductive patterns which are located at a same side of two sub-pixel regions in the column direction, and a length of a projection of the first connecting pattern in the row direction is smaller than a length of a projection of the conductive pattern in the row direction (e.g., in FIG. 2 and FIG. 7, a width of the first connecting pattern D4 in the row direction is smaller than a width of the conductive pattern D3 in the row direction). In this way, it can lower the possibility of the electrical field line with a starting point on the pixel electrode to be terminated on the first connecting pattern, so as to reduce the interference to the electrical field distribution in the column direction caused by the arrangement of the first connecting pattern.

From a sixth aspect, the conductive pattern is always located between two adjacent gate lines so that the overlap of the conductive pattern with the gate line can be avoided and the parasitic capacitance there-between can be reduced.

From a seventh aspect, a line width of the gate line at an intersection with the data line is smaller than a line width of the gate line between two adjacent data lines. In this way, the parasitic capacitance between the gate line and the data line can be reduced.

From an eighth aspect, a line width of the common voltage line at an intersection with the data line is smaller than a line width of the common voltage line between two adjacent data lines. In this way, the parasitic capacitance between the layer structure applied with the common voltage in the first conductive layer and the data line can be reduced, which facilitates mitigating the signal delay on the data line and the crosstalk.

From a ninth aspect, the data line, and the first pole of the switching transistor are connected by the extension pattern of the data line, and the extension pattern is provided with an opening at a portion overlapped with the gate line. It can be seen that, based on the design in which the extension pattern is provided with an opening at a portion overlapped with the gate line, the parasitic capacitance between the data line and the gate line can be reduced. In addition, in array substrates of the two structures, the above-mentioned extension pattern includes two line-shaped portions Es1 and Es2 (illustrated in FIG. 5 and FIG. 9) which extend along the row direction. In this way, when one of the extension portions is broken due to craft or external force, the electric connection between the first pole of the switching transistor and the data line can also be maintained by other line-shaped portion(s). It can be seen that, based on the design in which the extension pattern includes more than one line-shaped portion extending along the row direction, the probability of open circuit occurred at the connecting point between the switching transistor and the data line may be reduced, which facilitates improving a product yield. It should be noted that, each of the above-mentioned aspects can achieve its respective technical effect(s), and those skill in the art can select design(s) from one or more of these aspects according to actual demands when implementing the present disclosure, which are not limited in the present disclosure.

The embodiment of the present disclosure also provides a display device including any of the array substrates.

The display device in the present embodiment may be any product or component with display function, such as display panel, mobile phone, tablet computer, television, display, notebook computer, digital photo frame, and navigator.

Compared to the existing technology, the display device provided by the embodiments of the present disclosure, in view of the same conductive pattern provided in the preceding embodiments, can mitigate the problems caused by the disorder of electrical field at edges of pixels in display devices, such as light leakage, and color mixture, and facilitate improving the pixel aperture ratio and achieving high resolution, thereby optimizing the display performance.

The foregoing are merely exemplary embodiments of the present disclosure, but not limitative to the scope of the present disclosure. The scope of the present disclosure shall be defined by the accompanying claims.

The present application claims priority of Chinese patent application No. 201621322702.2 filed on Dec. 5, 2016, the disclosure of which is incorporated herein in its entirety by reference.

What is claimed is:

1. An array substrate, comprising:
    a plurality of sub-pixel regions arranged in rows and columns, each sub-pixel region of the plurality of sub-pixel regions comprising a pixel aperture region;
    a common electrode, provided in each sub-pixel region;
    a first conductive pattern, provided between two adjacent sub-pixel regions in a row direction, at least part of the first conductive pattern being located between pixel aperture regions of the two adjacent sub-pixel regions in the row direction, and the first conductive pattern being connected to a common voltage; and
    a first connecting pattern, provided in each sub-pixel region and outside of the pixel aperture region, the first connecting pattern being configured to connect common electrodes of two adjacent sub-pixel regions in a column direction with each other.

2. The array substrate according to claim 1, wherein the common electrode is connected to the common voltage by connecting to a common voltage line, and the common voltage line is provided between two adjacent rows of pixel aperture regions.

3. The array substrate according to claim 2, wherein the array substrate comprises a first conductive layer in which both of the first conductive pattern and the common electrode are provided.

4. The array substrate according to claim 3, wherein the common electrode is connected to at least one adjacent conductive pattern, located between a sub-pixel region where the common electrode is located and an adjacent sub-pixel region.

5. The array substrate according to claim 3, further comprising a second conductive pattern, wherein the first conductive pattern and the second conductive pattern are provided at two sides of a same sub-pixel region in the row direction and connected to each other.

6. The array substrate according to claim 3, wherein the first conductive pattern comprises two conductive patterns, the two conductive patterns are further provided at a same side of the two adjacent sub-pixel regions in the column direction and connected to each other.

7. The array substrate according to claim 3, wherein the first conductive pattern comprises two conductive patterns, further provided at a same side of the two adjacent sub-pixel regions in the column direction, and wherein, in the first conductive layer, the first connecting pattern is provided between the two conductive patterns;
    a data line is provided between two adjacent columns of pixel aperture regions; and
    at least a part of the first connecting pattern is separated from the data line.

8. The array substrate according to claim 3, further comprising a second conductive pattern, wherein the first conductive pattern and second conductive pattern are provided at two sides of a same sub-pixel region in the row direction, wherein, in the first conductive layer, a second connecting pattern is provided between the first conductive pattern and the second conductive pattern;
    a data line is provided between two adjacent columns of pixel aperture regions; and
    at least a part of a region where the second connecting pattern is provided is separated from a region where the data line is provided.

9. The array substrate according to claim 7, wherein each conductive pattern of the two conductive patterns is located between two adjacent common voltage lines;
    the first connecting pattern is connected to the common voltage line at a portion overlapped with the common voltage line; and
    each conductive pattern is connected to the common voltage line by the first connecting pattern.

10. The array substrate according to claim 7, wherein a length of a projection of the first connecting pattern in the row direction is smaller than a length of a projection of each conductive pattern of the two conductive patterns in the row direction.

11. The array substrate according to claim 3, wherein a material of the first conductive layer is a metallic material.

12. The array substrate according to claim 2, wherein each sub-pixel region of the plurality of the sub-pixel regions is provided with a pixel electrode, the pixel electrode including an extension portion extending along the row direction, the extension portion and the common voltage line being overlapped with each other.

13. The array substrate according to claim 2, wherein a gate line is provided between two adjacent rows of pixel aperture regions, and a data line is provided between two adjacent columns of pixel aperture regions, a line width of the gate line at an intersection with the data line being smaller than a line width of the gate line between two adjacent data lines, and/or, a line width of the common voltage line at an intersection with the data line being smaller than a line width of the common voltage line between two adjacent data lines.

14. The array substrate according to claim 1, wherein a gate line is provided between two adjacent rows of pixel aperture regions; and the first conductive pattern is located between two adjacent gate lines.

15. The array substrate according to claim 1, wherein each sub-pixel region of the plurality of the sub-pixel regions is provided with a pixel electrode;
 a gate line is provided between two adjacent rows of pixel aperture regions;
 a data line is provided between two adjacent columns of pixel aperture regions; and
 each sub-pixel region of the plurality of the sub-pixel regions is further provided with a switching transistor, a gate of the switching transistor being connected to the gate line, a first pole other than the gate being connected to the data line, and a second pole being connected to the pixel electrode, wherein the data line and the first pole of the switching transistor are connected by an extension pattern of the data line, the extension pattern being provided with an opening at a portion overlapped with the gate line.

16. The array substrate according to claim 1, wherein a gate line is provided between two adjacent rows of pixel aperture regions;
 a data line is provided between two adjacent columns of pixel aperture regions; and
 each sub-pixel region of the plurality of the sub-pixel regions is further provided with a switching transistor, a gate of the switching transistor being connected to the gate line, a first pole other than the gate being connected to the data line, and a second pole being connected to a pixel electrode, wherein the data line and the first pole of the switching transistor are connected by an extension pattern of the data line, the extension pattern including more than one line-shaped portion extending along the row direction.

17. A display device, comprising the array substrate according to claim 1.

18. The array substrate according to claim 4, further comprising a second conductive pattern, wherein the first conductive pattern and the second conductive pattern are provided at two sides of a same sub-pixel region in the row direction and connected to each other.

19. The array substrate according to claim 4, wherein the first conductive patterns comprises two conductive pattern, the two conductive patterns are further provided at a same side of the two adjacent sub-pixel regions in the column direction and connected to each other.

* * * * *